(12) United States Patent
Savagian et al.

(10) Patent No.: US 8,358,095 B2
(45) Date of Patent: Jan. 22, 2013

(54) METHOD AND SYSTEM FOR TESTING ELECTRIC MOTORS

(75) Inventors: Peter J. Savagian, Bloomfield Hills, MI (US); Steven E. Schulz, Torrance, CA (US); Silva Hiti, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 736 days.

(21) Appl. No.: 12/533,762

(22) Filed: Jul. 31, 2009

(65) Prior Publication Data

US 2011/0025247 A1 Feb. 3, 2011

(51) Int. Cl.
*G01R 31/02* (2006.01)
*H02H 3/04* (2006.01)
*H02K 11/00* (2006.01)

(52) U.S. Cl. ........ 318/490; 318/159; 318/160; 318/436; 318/40

(58) Field of Classification Search .................. 318/490, 318/159, 160, 436, 40
See application file for complete search history.

(56) References Cited

U.S. PATENT DOCUMENTS 6,577,137 B1 * 6/2003 Fisher ........................... 324/500

* cited by examiner

*Primary Examiner* — Walter Benson
*Assistant Examiner* — Erick Glass
(74) *Attorney, Agent, or Firm* — Ingrassia Fisher & Lorenz, P.C.

(57) ABSTRACT

Method and systems for testing an electric motor are provided. A switching circuit coupled to the motor is operated in a first mode causing current to flow through the motor such that the motor is actuated with near zero torque. A magnitude of the current is repeatedly adjusted between first and second values. The current flow through the motor is monitored.

17 Claims, 6 Drawing Sheets

METHOD AND SYSTEM FOR TESTING ELECTRIC MOTORS

TECHNICAL FIELD

The present invention generally relates to electric motors, and more particularly relates to a method and system for testing electric motors, such as electric motors for electric automotive drive systems.

BACKGROUND OF THE INVENTION

In recent years, advances in technology, as well as ever-evolving tastes in style, have led to substantial changes in the design of automobiles. One of the changes involves the complexity of the electrical and drive systems within automobiles, particularly alternative fuel vehicles, such as hybrid, battery electric, and fuel cell vehicles. Such alternative fuel vehicles typically use one or more electric motors, perhaps in combination with another actuator, to drive the wheels.

These machines (i.e., the motors) are expected to function over extreme operating conditions for an extended lifetime with high reliability. However, due to the operating stresses applied to the motor or manufacturing defects, failures can occur. Because of the integration of the motors with other components in the vehicle, such as the transmission, repairing, replacing, or even testing the motors after the vehicle is assembled often requires at least partial disassembly of the vehicle. The complexity of such a procedure significantly increases maintenance costs.

Accordingly, it is desirable to provide a method and system for testing an electric motor that suitably stresses the motor before the motor is installed in the vehicle. Additionally, it is desirable to provide such a method and system that allows the motor to be tested without the use of a lubricating fluid that is typically provided during normal use. Furthermore, other desirable features and characteristics of the present invention will become apparent from the subsequent description taken in conjunction with the accompanying drawings and the foregoing technical field and background.

SUMMARY OF THE INVENTION

A method for testing an electric motor having first and second components and coupled to a switching circuit is provided. The switching circuit is operated in a first mode. The first mode causes current to flow through at least one of the first and second components such that the second component rotates relative to the first component with near zero torque. A magnitude of the current is repeatedly adjusted between a first amperage and a second amperage during the operating of the switching circuit in the first mode. The current flow through the at least one of the first and second components is monitored.

A method for testing an electric motor having a stator and rotor and coupled to a switching circuit is provided. The switching circuit is operated in a first mode. The first mode causes current to flow through at least one of the stator and rotor such that the rotor component rotates relative to the stator. The current is such that if represented by a current vector on a d-q coordinate system, an angle between the current vector and the d-axis would be near zero. A magnitude of the current is repeatedly adjusted between a first amperage and a second amperage during the operating of the switching circuit in the first mode. The switching circuit is operated in a second mode. The second mode causes the current to flow through the at least one of the stator and the rotor such that the rotor does not rotate relative to the stator and to have a third amperage. The switching circuit is at least partially deactivated such that the current decays from the at least one of the stator and the rotor. The decay of the current is monitored after the at least partially deactivating of the switching circuit. An indication of a potential failure of the electric motor is generated based on the decay of the current after the at least partially deactivating of the switching circuit.

A system for testing an electric motor comprising a stator and a rotor is provided. The system includes an inverter having a switching circuit and a processor in operable communication with the inverter. The processor being configured to operate the switching circuit in a first mode, the first mode causing current to flow through at least one of the stator and the rotor such that the rotor rotates relative to the stator with near zero torque, repeatedly adjust a magnitude of the current between a first amperage and a second amperage during the operating of the switching circuit in the first mode, operate the switching circuit in a second mode, the second mode causing the current to flow through the at least one of the stator and the rotor such that the rotor does not rotate relative to the stator and to have a third amperage, at least partially deactivate the switching circuit such that the current decays from the at least one of the first and second components, and monitor the decay of the current after the at least partially deactivating of the switching circuit.

DESCRIPTION OF THE DRAWINGS

The present invention will hereinafter be described in conjunction with the following drawing figures, wherein like numerals denote like elements.

DESCRIPTION OF AN EXEMPLARY EMBODIMENT

Figure 1:
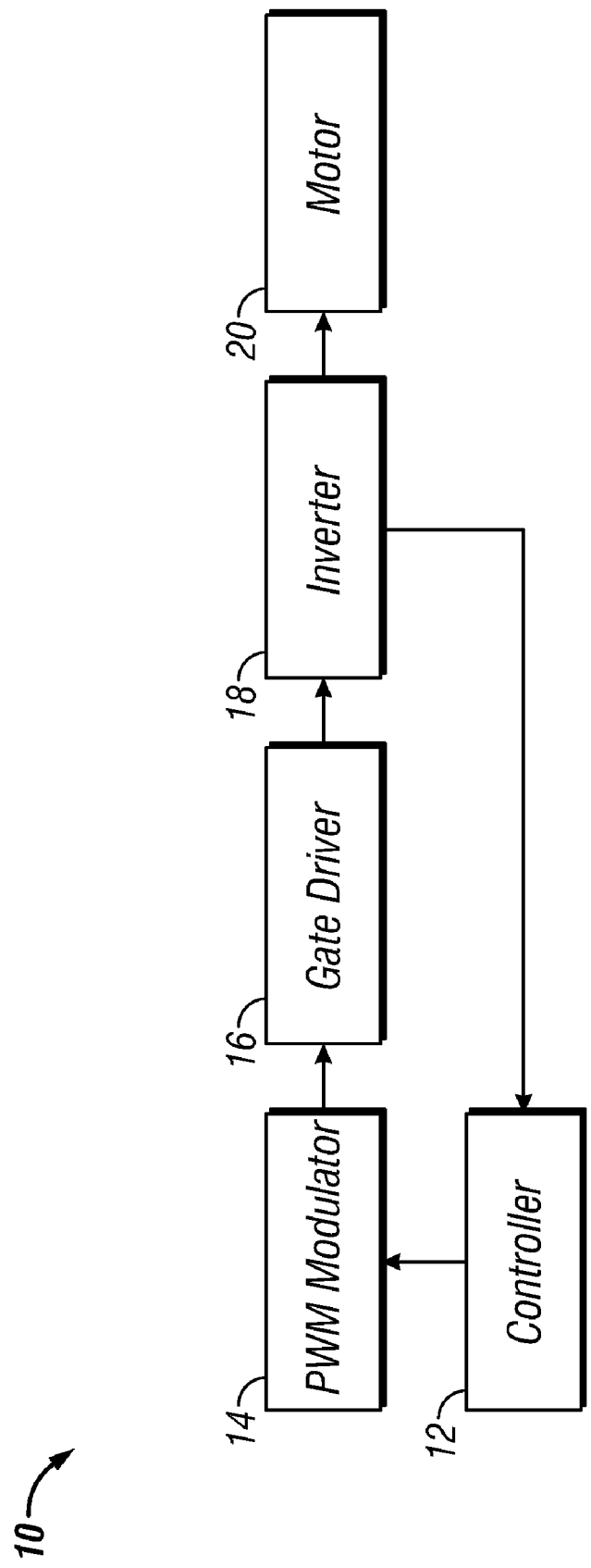
FIG. 1 is a block diagram of a system for testing an electric motor, according to one embodiment of the present invention.

The following detailed description is merely exemplary in nature and is not intended to limit the invention or the application and uses of the invention. Furthermore, there is no intention to be bound by any expressed or implied theory presented in the preceding technical field, background, and brief summary, or the following detailed description.

The following description refers to elements or features being "connected" or "coupled" together. As used herein, "connected" may refer to one element/feature being mechanically joined to (or directly communicating with) another element/feature, and not necessarily directly. Likewise, "coupled" may refer to one element/feature being directly or indirectly joined to (or directly or indirectly communicating with) another element/feature, and not necessarily mechanically. However, it should be understood that although two elements may be described below, in one embodiment, as being "connected," in alternative embodiments similar elements may be "coupled," and vice versa. Thus, although the schematic diagrams shown herein depict example arrangements of elements, additional intervening elements, devices, features, or components may be present in an actual embodiment.

Further, various components and features described herein may be referred to using particular numerical descriptors, such as first, second, third, etc., as well as positional and/or angular descriptors, such as horizontal and vertical. However, such descriptors may be used solely for descriptive purposes relating to drawings and should not be construed as limiting, as the various components may be rearranged in other embodiments. It should also be understood that FIGS. 1-6 are merely illustrative and may not be drawn to scale.

FIG. 1 to FIG. 6 illustrate a method and system for providing a motor burn-in end of line (EOL) test. The test is used to stress an electric machine (i.e., motor) in an attempt to induce or detect potential failures due to latent manufacturing defects. In one embodiment, no dynamometer or sophisticated test equipment is required. In order to test the motor without lubrication (i.e., before being installed), the mechanical speed may be restricted to low values (e.g., 100-150 rpm).

In one embodiment, a method for testing an electric motor comprising first and second components (e.g., a stator and a rotor) and coupled to a switching circuit is provided. The switching circuit is first operated in a first mode. The first mode causes current to flow through at least one of the first and second components such that the second component rotates relative to the first component with near zero (or minimal) torque. In other words, if the current were represented by a current vector on a d-q coordinate system, an angle between the current vector and the d-axis would be near zero.

While still operating in the first mode, a magnitude of the current is repeatedly adjusted, or switched, between a first amperage and a second amperage and the current flow through the appropriate component is monitored.

In one embodiment, the switching circuit is then operated in a second mode. The second mode causes the current to flow through the at least one of the first and second components such that the second component does not rotate relative to the first component (i.e., with a zero torque command) and at a third amperage. Then the switching circuit is at least partially deactivated such that the current decays from the at least one of the first and second components. The decay of the current is monitored. That rate at which the current decays may be indicative of failures, or potential failures, in the electric motor.

Referring to FIG. 1, a system 10 for testing a motor, in accordance with an exemplary embodiment of the present invention, is shown. The system 10 includes a controller 12, a Pulse Width Modulation (PWM) modulator, 14, a gate driver 16, an inverter 18, and a motor 20. It should be understood that the system 10 shown in FIG. 1 may be temporarily formed after the assembly of the motor 20 for the purpose of testing the motor 20 before it is installed in a vehicle.

As shown, the controller 12 is operable communication with the PWM modulator 14, which is coupled to the gate driver 16, which in turn has an output coupled to an input of the inverter 18. The inverter 18 has a second output coupled to the motor 20. The controller 12 and the PWM modulator 14 may be integral within an electronic control system. As is commonly understood, such a control system, although not shown in detail, may include at least one processor and/or a memory which includes instructions stored thereon (or in another computer-readable medium) for carrying out the processes and methods as described below.

Figure 2:
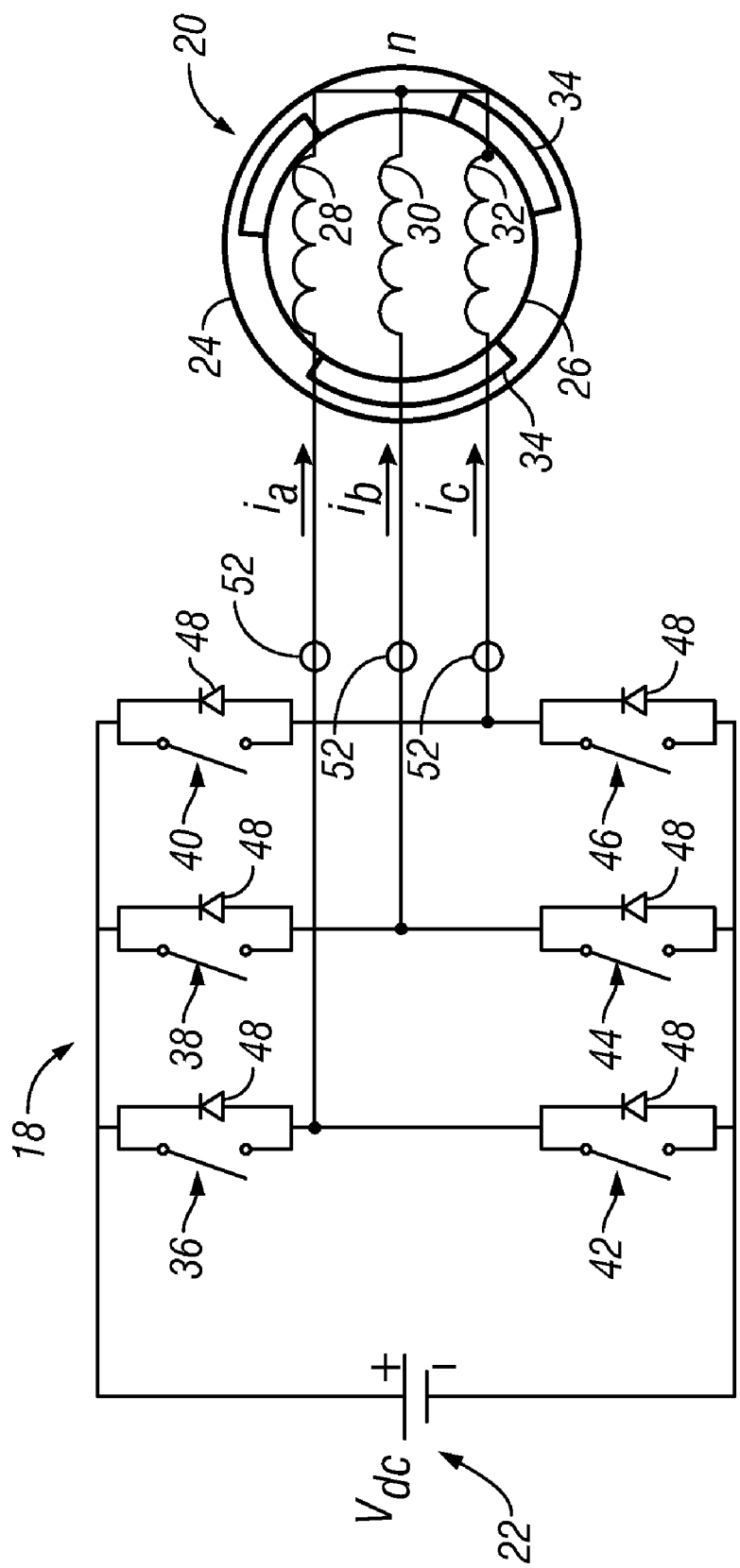
FIG. 2 is a schematic view of an inverter and an electric motor within the system of FIG. 1.

FIG. 2 schematically illustrates the inverter 18 and the motor 20 of FIG. 1 in greater detail. The inverter 18 includes a three-phase circuit coupled to the motor 20. More specifically, the inverter 18 includes a switch network having a first input coupled to a voltage source ($V_{dc}$) 22 and an output coupled to the motor 20. Although a single voltage source is shown, a distributed DC link with two series sources may be used.

As will be appreciated by one skilled in the art, the electric motor 20, in one embodiment, includes a stator assembly 24 and a rotor assembly 26. The stator assembly 24 includes a plurality (e.g., three) conductive coils or windings 28, 30, and 32, each of which is associated with one of three phases of the electric motor 20, as is commonly understood. The rotor assembly 26 includes a plurality of magnets 34 and is rotatably coupled to the stator assembly 24, as is commonly understood. The magnets 34 may include multiple electromagnetic poles (e.g., sixteen poles), as is commonly understood. It should be understood that the description provided above is intended as example of one type of electric motor that may be used. One skilled in the art will appreciate that the techniques described below may be applied to any type of electric motor.

The switch network comprises three pairs (a, b, and c) of series switches with antiparallel diodes (i.e., antiparallel to each switch) corresponding to each of the phases of the motor 20. Each of the pairs of series switches comprises a first switch, or transistor, (i.e., a "high" switch) 36, 38, and 40 having a first terminal coupled to a positive electrode of the voltage source 22 and a second switch (i.e., a "low" switch) 42, 44, and 46 having a second terminal coupled to a negative electrode of the voltage source 22 and a first terminal coupled to a second terminal of the respective first switch 36, 38, and 40.

As is commonly understood, each of the switches 36-46 may be in the form of individual semiconductor devices such as insulated gate bipolar transistors (IGBTs) within integrated circuits formed on semiconductor (e.g. silicon) substrates (e.g., die). As shown, a diode 48 is connected in an antiparallel configuration (i.e., "flyback diodes") to each of the switches 36-46.

Still referring to FIG. 2, the inverter 18 and/or the motor 20 includes a plurality of current sensors 52, each of which is configured to detect the flow of current through a respective one of the windings 28, 30, and 32 of the motor 20 (and/or through the respective switches 36-46 or diodes 48).

Figure 3:
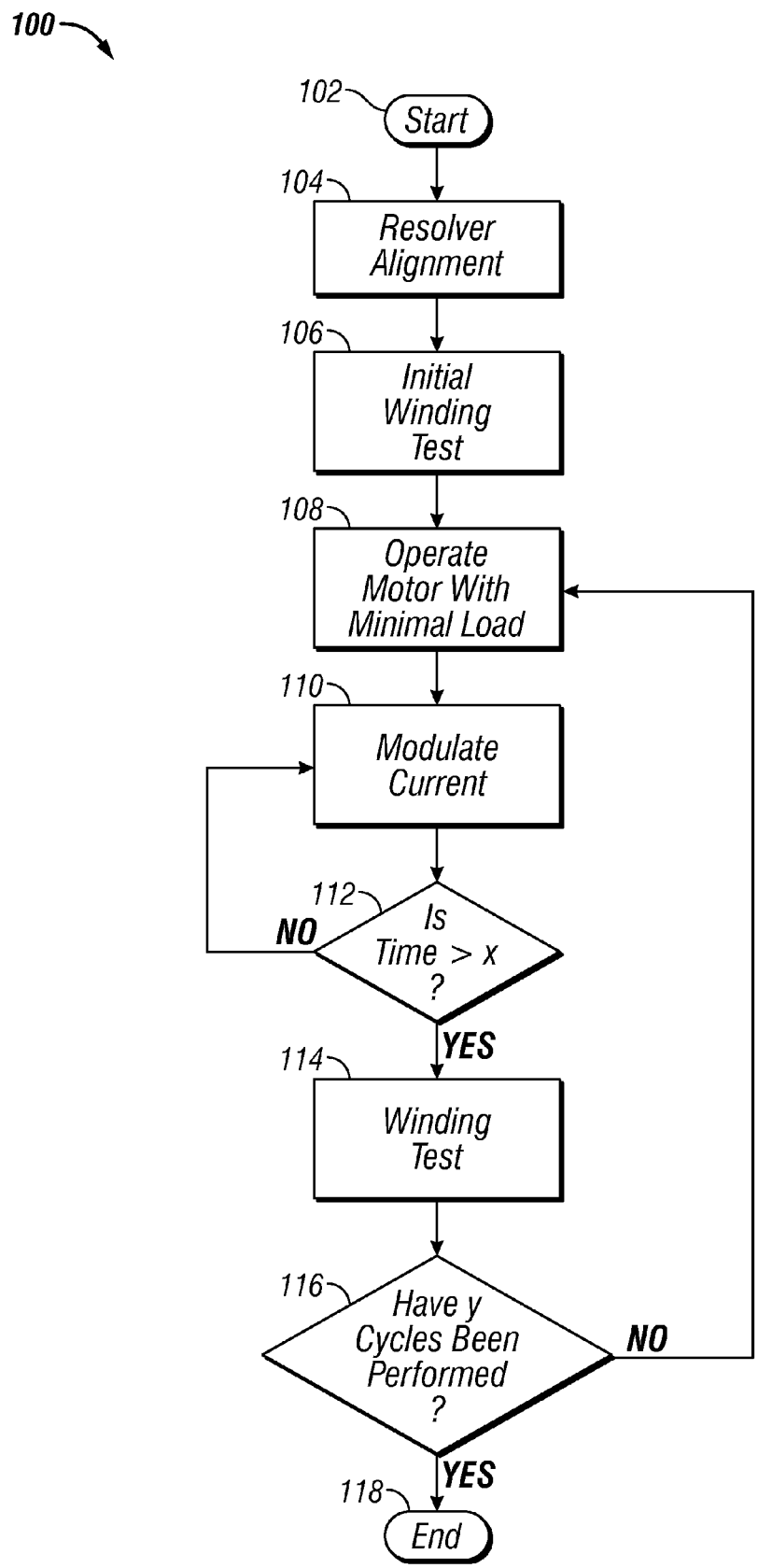
FIG. 3 is a flow chart illustrating a method for testing an electric motor, according to one embodiment of the present inventions.

FIG. 3 illustrates a method 100 for testing the motor 20, in accordance with one embodiment of the present invention. At step 102, the method 100 is initiated. The initiation of the method 100 may include connecting the motor 20 to the inverter 18 and the voltage source 22, which may not be located on-board a vehicle, as shown in FIGS. 1 and 2.

At step 104, the motor 20 undergoes resolver alignment, as is commonly understood in the art. In one embodiment, a rotating current vector is applied in order to spin the rotor 26 at a low speed to determine the resolver offset. At the end of this step, the determined resolver offset value is stored for the duration of the test.

Figure 4:
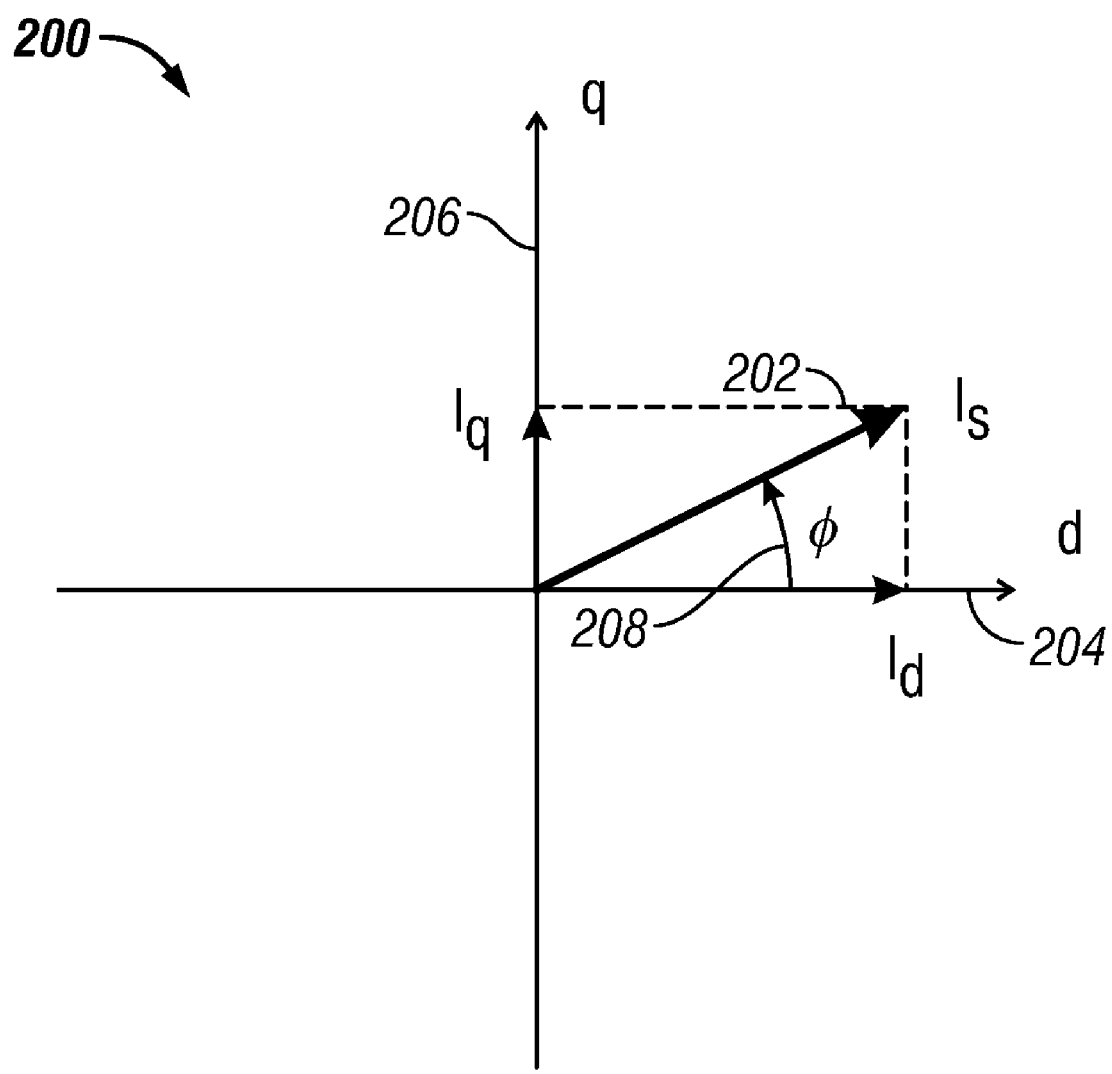
FIG. 4 is a Cartesian coordinate system illustrating a motor current vector within a synchronous frame of reference.
Figure 5:
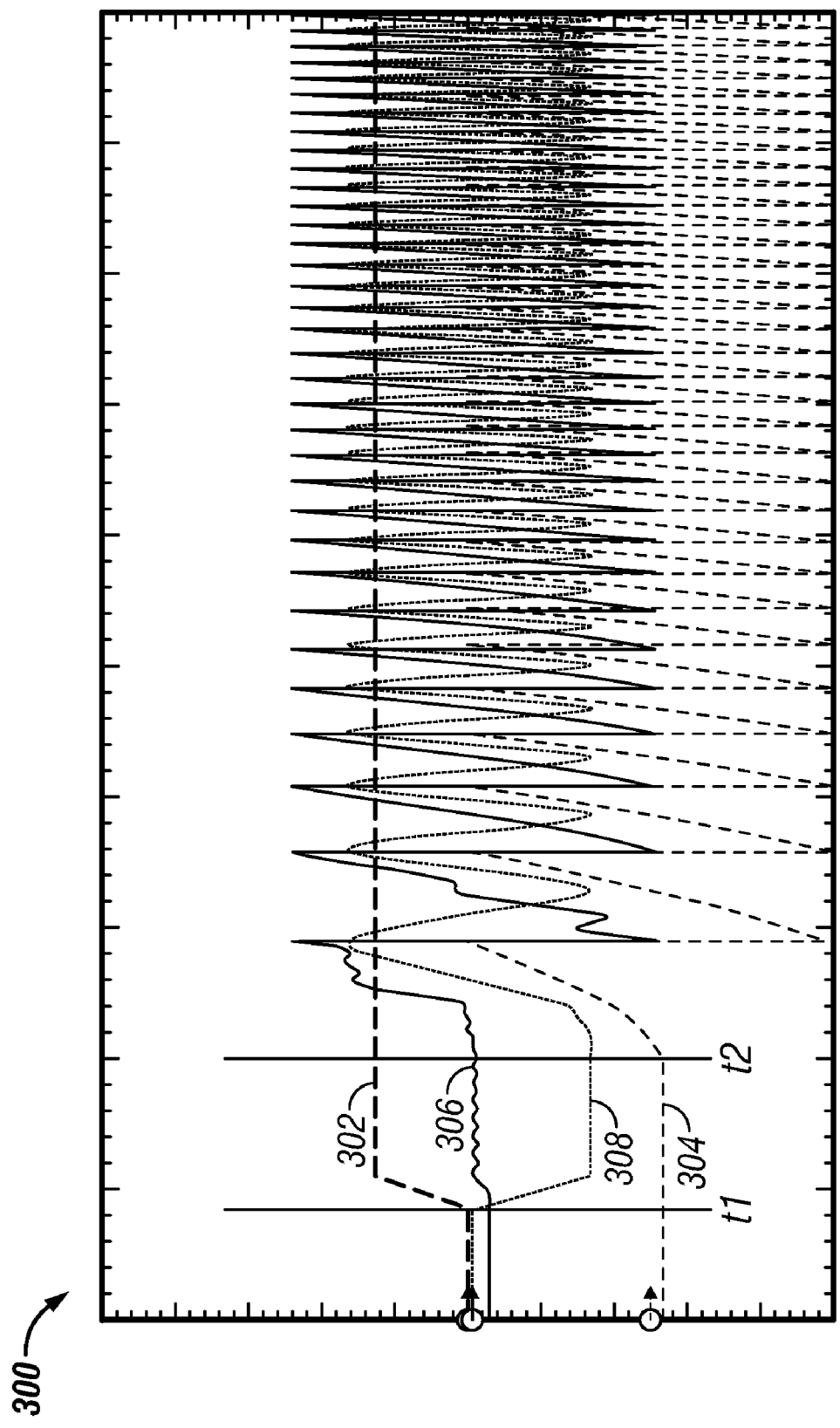
FIG. 5 is a scope plot illustrating various characteristics of motor start-up, according to one embodiment of the present invention.

FIG. 4 in conjunction with FIG. 3, during step 104, the current vector 202 ($I_s$) is rotated at a constant angular velocity, independent of any rotor position or speed measurement. For a permanent magnet synchronous motor, the rotor will tend to follow the rotating current vector. The rotor rotates such that the rotor d-axis 204 (i.e., defined as being aligned with the rotor magnets 34 North pole) tends to align with the stator current vector 202. As shown in FIG. 5, the stator current vector (202) has projections on both the d-axis 204 ($I_d$) and the q-axis 206 ($I_q$) of the motor 20. The motor torque is a function of the q-axis current, as shown in Equation 1 below for an interior permanent magnet (IPM) motor. There is no torque (i.e., torque is zero) when the q-axis current is zero. Therefore, for zero drag and load torque, in steady-state the current vector (202) aligns with the d-axis (204) to produce zero torque.

$$T_e = \frac{3p}{4}[i_q \lambda_{pm} - i_d i_q \cdot (L_q - L_d)] \quad (1)$$

In practical applications, there is a small drag torque due to friction, windage, etc., requiring a corresponding torque from the motor 20 to maintain rotation. To provide the necessary torque, the stator current vector 202 leads the motor d-axis 204 such that a small positive q-axis current is generated. The phase shift, or current vector angle, ($\phi$) 208 is proportional to the drag torque. As drag torque increases, the phase shift 208 also increases, placing a larger portion of the stator current in the q-axis 206. As drag torque is normally quite small in relation to the maximum torque capability of a motor, the phase shift 208 is negligible for any significant current vector amplitude. Thus, the resolver offset (i.e., the difference between resolver indication of the absolute zero position, and the position of the rotor magnet North Pole) may be determined from the difference of current vector position and resolver measured position.

An advantage of operating the motor 20 in this fashion is that significant d-axis, non-torque producing current may be applied to the motor 20, thus thermally stressing the stator windings 28, 30, and 32, while producing a small amount of torque, sufficient to counteract the drag torque.

FIG. 5 illustrates a scope plot 300 demonstrating motor start-up using the rotating stator current vector technique in terms of stator current 302, current vector angle 304, rotor position 306, and phase current 308. Stator current (i.e., stator current vector amplitude) 300 is applied at t1. At t2, the stator current vector 304 begins rotating, as indicated by the current vector angle 304. As shown, the measured rotor position 306 tracks the stator current vector angle 304. During acceleration, there may be significant phase shift as additional torque is necessary to accelerate the inertia of the motor. Once the current vector obtains a constant angular velocity, the phase shift $\phi$ (FIG. 4) reduces to a small value since the drag torque is minimal.

Referring again to FIG. 3, at step 106, the measured offset is added to the measured position, and the measured position is used to perform a "stator time constant" test. During the stator time constant test, stator current is applied at zero speed (i.e., with a zero torque command). During a first portion of the test, when the current magnitude reaches a pre-defined threshold, a three-phase short is applied (e.g., switches 36, 38, and 40 are turned ON while switches 42, 44, and 46 are turned OFF) and the phase current decay is measured. In the second portion of test, current is again and applied, and after it reaches a pre-defined threshold, a three-phase open is applied (e.g., switches 36-46 are turned OFF) and current decay is again measured. The decay times for healthy stator winding need to be in a certain range for both portions of the test. Although not shown in FIG. 4, if the windings are determined to not fail within this range, the results may be reported via fault codes (or lack thereof) or other generated indication (e.g., on a computer console).

At step 108, the motor 20 is again operated at a minimal load or with minimal, or near zero, torque, as described above during the resolver alignment, at a relatively low speed (e.g., 120 rpm). In one embodiment, the current vector angle 208 (FIG. 4) during this step may be between 1 to 5 degrees.

The winding current is then modulated at step 110. As will be appreciated by one skilled in the art, the amplitude of the stator current vector 202 may be modulated to apply time varying stress levels to the motor 20 and excite winding forces in the attempt to precipitate winding faults due to manufacturing defects. In one embodiment, the current magnitude is toggled between a low amperage (e.g., 50 A) and a high amperage (e.g., 300 A) at a frequency of, for example, 1 Hertz (Hz). The high amperage current may be the predetermined maximum for the particular stator 24 or inverter 18 in use.

The current modulation may cause the motor temperature to increase due to the induced losses, which may help expose faults that may not be detectable at lower temperatures. As such, the temperature of the motor 20 may be monitored during the current modulation. If the motor temperature exceeds a predetermined limit, the current modulation may be altered to reduce the average winding current and prevent the windings from being damaged. The average winding current may be regulated by either reducing the amplitude of the high amperage current, or by reducing its duty cycle (i.e., the ratio of time duration of high amperage current to time duration of low amperage current).

As indicated by step 112, the current modulation is performed for a predetermined amount (x) of time (e.g., 15 minutes). After that, the speed and current are brought back to zero, the algorithm switches to measured position, and at step 114, the stator time constant test is performed again. Because of the current modulation performed at step 110, the likelihood that any near winding faults may be discovered using the stator time constant test is increased. The results of the test may be reported via fault codes (or a lack thereof) or other generated indication (e.g., on a computer console).

As indicated at step 116, the sequence of steps 108-114 is, in one embodiment, performed a predetermined number (y) of times (e.g., four). This, combined with step 112, allows for the current modulation to be performed in a very particular manner, as is desired by the user. At step 118, the method 100 ends.

Additionally, a high-potential ("hi-pot") test, as is commonly understood, may be performed after the motor 20 has run through the burn-in test described above while the stator windings are still at elevated temperature.

In an exemplary hi-pot test, high voltage is applied between the windings 28, 30, and 32 and the stator 24 frame itself. The resulting current, known as leakage current, may be monitored by conventional test equipment. If the current exceeds a predetermined threshold, it may be assumed that a fault within the windings 28, 30 and 32 exists.

One advantage of the method and system described above is that the motor may be tested prior to being installed in a vehicle in such a way as to suitably stress the windings, while operating the motor at relatively low speeds. As a result, there is no need to provide lubricating fluid to the motor during the test, which reduces manufacturing costs and decreases the likelihood that the motor will experience a failure after being installed in the vehicle.

Figure 6:
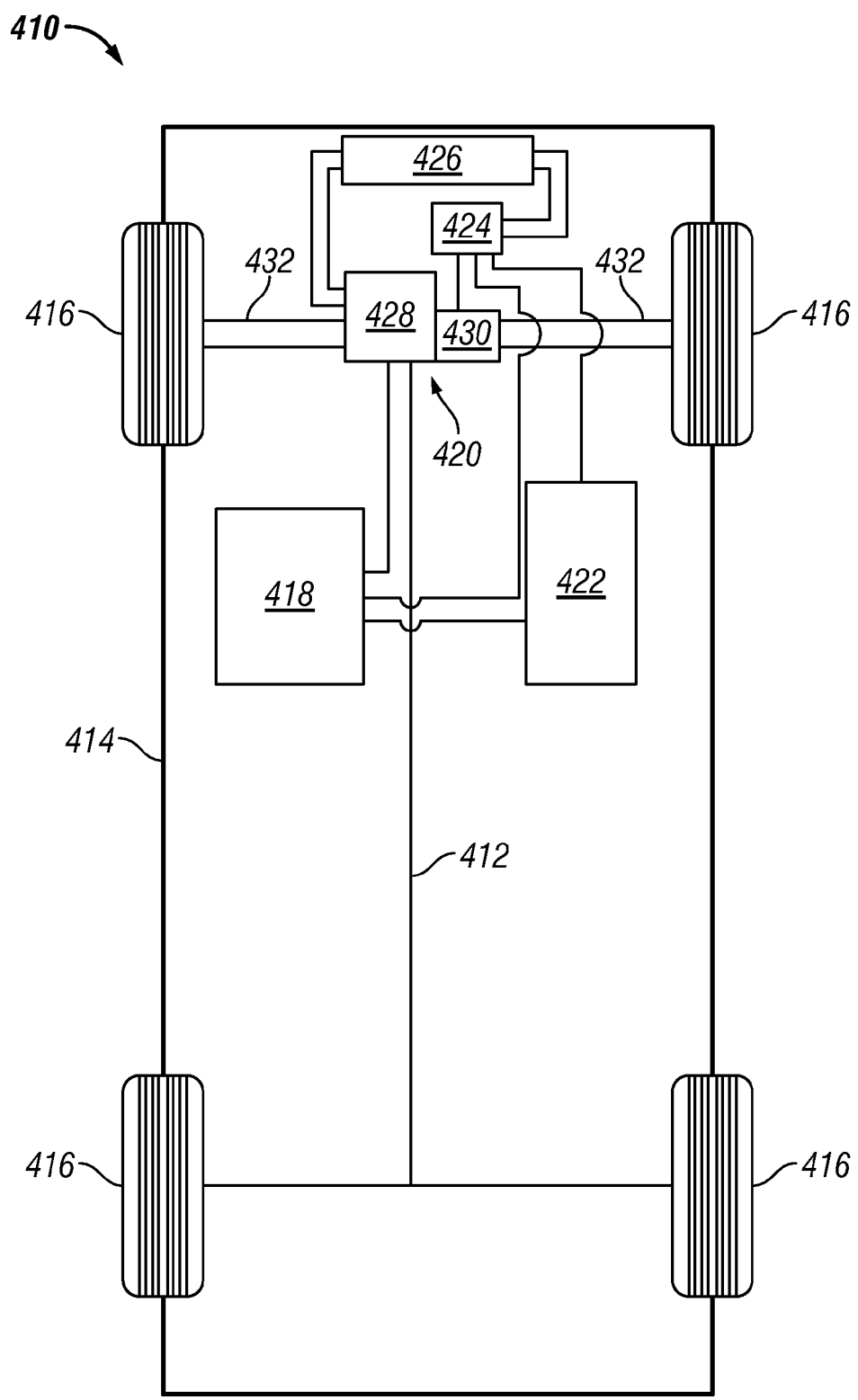
FIG. 6 is a schematic view of an exemplary automobile according to one embodiment of the present invention.

After testing, the motor 20 may be installed in and/or integrated with a transmission, and subsequently installed in a vehicle, such as an automobile. FIG. 6 illustrates an example of such a vehicle (or "automobile") 410. The automobile 410 includes a chassis 412, a body 414, four wheels 416, and an electronic control system 418. The body 414 is arranged on the chassis 412 and substantially encloses the other components of the automobile 410. The body 414 and the chassis 412 may jointly form a frame. The wheels 416 are each rotationally coupled to the chassis 412 near a respective corner of the body 414.

The automobile 410 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The automobile 410 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, a combustion/electric motor hybrid engine (i.e., such as in a hybrid electric vehicle (HEV)), and an electric motor.

In the exemplary embodiment illustrated in FIG. 6, the automobile 410 is an HEV, and further includes an actuator assembly 420, a battery (or a DC power supply) 422, a power converter assembly (e.g., an inverter or inverter assembly) 424, and a radiator 426. The actuator assembly 420 includes a combustion engine 428 and an electric motor/generator (or motor) 430 (e.g., the motor 20 described above).

Still referring to FIG. 6, the combustion engine 428 and/or the electric motor 430 are integrated such that one or both are mechanically coupled to at least some of the wheels 416 through one or more drive shafts 432. In one embodiment, the automobile 410 is a "series HEV," in which the combustion engine 428 is not directly coupled to the transmission, but coupled to a generator (not shown), which is used to power the electric motor 430. In another embodiment, the automobile 410 is a "parallel HEV," in which the combustion engine 428 is directly coupled to the transmission by, for example, having the rotor of the electric motor 430 rotationally coupled to the drive shaft of the combustion engine 428.

The radiator 426 is connected to the frame at an outer portion thereof and although not illustrated in detail, includes multiple cooling channels therein that contain a cooling fluid (i.e., coolant) such as water and/or ethylene glycol (i.e., "antifreeze") and is coupled to the engine 428 and the inverter 424. In the depicted embodiment, the inverter 424 receives and shares coolant with the electric motor 430. However, other embodiments may use separate coolants for the inverter 424 and the electric motor 430. The radiator 426 may be similarly connected to the inverter 424 and/or the electric motor 430.

The electronic control system 418 is in operable communication with the actuator assembly 420, the high voltage battery 422, and the inverter 18. Although not shown in detail, the electronic control system 418 includes various sensors and automotive control modules, or electronic control units (ECUs), such as an inverter control module, a motor controller, and a vehicle controller, and at least one processor and/or a memory which includes instructions stored thereon (or in another computer-readable medium).

During normal operation (i.e., driving), referring to FIG. 4, the automobile 410 is operated by providing power to the wheels 416 with the combustion engine 428 and the electric motor 430 in an alternating manner and/or with the combustion engine 428 and the electric motor 430 simultaneously. In order to power the electric motor 430, DC power is provided from the battery 422 (and, in the case of a fuel cell automobile, a fuel cell) to the inverter 424, which converts the DC power into AC power, before the power is sent to the electric motor 430. As will be appreciated by one skilled in the art, the conversion of DC power to AC power is substantially performed by operating (i.e., repeatedly switching) the transistors within the inverter 424 at a "switching frequency," such as, for example, 12 kilohertz (kHz). The inverter 424 then converts the PWM signal to a modulated voltage waveform for operating the motor 430.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for testing an electric motor comprising first and second components and coupled to a switching circuit, the method comprising:
   operating the switching circuit in a first mode, the first mode causing current to flow through at least one of the first and second components such that the second component rotates relative to the first component with near zero torque;
   repeatedly adjusting a magnitude of the current between a first amperage and a second amperage during the operating of the switching circuit in the first mode;
   monitoring the current flow through the at least one of the first and second components; and
   operating the switching circuit in a second mode, the second mode causing the current to flow through the at least one of the first and second components such that the second component does not rotate relative to the first component and to have a third amperage,
   wherein the electric motor is an automotive electric motor and the switching circuit within an inverter not on-board an automobile; monitoring the decay of the current after the at least partially deactivating of the switching circuit; and
   generating an indication of a potential failure of the electric motor based on the decay of the current after the at least partially deactivating of the switching circuit.

2. The method of claim 1, further comprising providing installing the electric motor in an automobile and providing a lubricating fluid to the electric motor after the monitoring of the decay of the current.

3. The method of claim 1, wherein the switching circuit comprises a plurality of switches coupled to the electric motor, and wherein the at least partially deactivating of the switching circuit comprises one of activating a first portion of the plurality of switches while deactivating a second portion of the plurality of switches and deactivating the first and second portions of the plurality of switches.

4. The method of claim 3, wherein the at least partially deactivating of the switching circuit comprises activating a first portion of the plurality of switches and deactivating a second portion of the plurality of switches.

5. The method of claim 4, further comprising:
   re-operating the switching circuit in the second mode after the monitoring of the decay of the current after the at least partially deactivating of the switching circuit;
   deactivating the first and second portions of the plurality of switches after the re-operating of the switching circuit in the second mode; and
   monitoring the decay of the current after deactivating the first and second portions of the switching circuit.

6. The method of claim 4, further comprising
monitoring a temperature of the electric motor; and
altering the adjusting of the magnitude of the current between the first and second amperages based on the temperature of the electric motor.

7. The method of claim 6, wherein the first component of the electric motor is a stator comprising a plurality of windings and the second component of the electric motor is a rotor rotatably coupled to the stator and comprising a plurality of magnets.

8. A method for testing an electric motor comprising a stator and rotor and coupled to a switching circuit, the method comprising:
operating the switching circuit in a first mode, the first mode causing current to flow through at least one of the stator and rotor such that the rotor component rotates relative to the stator, the current being such that if represented by a current vector on a d-q coordinate system, an angle between the current vector and the d-axis would be near zero;
repeatedly adjusting a magnitude of the current between a first amperage and a second amperage during the operating of the switching circuit in the first mode;
operating the switching circuit in a second mode, the second mode causing the current to flow through the at least one of the stator and the rotor such that the rotor does not rotate relative to the stator and to have a third amperage;
at least partially deactivating the switching circuit such that the current decays from the at least one of the stator and the rotor;
monitoring the decay of the current after the at least partially deactivating of the switching circuit; and
generating an indication of a potential failure of the electric motor based on the decay of the current after the at least partially deactivating of the switching circuit.

9. The method of claim 8, wherein the switching circuit comprises a plurality of switches coupled to the electric motor, and wherein the at least partially deactivating of the switching circuit comprises one of activating a first portion of the plurality of switches while deactivating a second portion of the plurality of switches.

10. The method of claim 9, further comprising:
re-operating the switching circuit in the second mode after the monitoring of the decay of the current after the at least partially deactivating of the switching circuit;
deactivating the first and second portions of the plurality of switches after the re-operating of the switching circuit in the second mode; and
monitoring the decay of the current after deactivating the first and second portions of the switching circuit.

11. The method of claim 10, wherein the electric motor is an automotive electric motor and the switching circuit within an inverter not on-board an automobile.

12. The method of claim 11, further comprising providing installing the electric motor in an automobile and providing a lubricating fluid to the electric motor after the monitoring of the decay of the current.

13. A system for testing an electric motor comprising a stator and a rotor, the system comprising:
an inverter comprising a switching circuit; and
a processor in operable communication with the inverter, the processor being configured to:
operate the switching circuit in a first mode, the first mode causing current to flow through at least one of the stator and the rotor such that the rotor rotates relative to the stator with near zero torque;
repeatedly adjust a magnitude of the current between a first amperage and a second amperage during the operating of the switching circuit in the first mode;
operate the switching circuit in a second mode, the second mode causing the current to flow through the at least one of the stator and the rotor such that the rotor does not rotate relative to the stator and to have a third amperage;
at least partially deactivate the switching circuit such that the current decays from the at least one of the first and second components; and
monitor the decay of the current after the at least partially deactivating of the switching circuit.

14. The system of claim 13, wherein the processor is further configured to generate an indication of a potential failure of the electric motor based on the decay of the current after the at least partially deactivating of the switching circuit.

15. The system of claim 14, wherein the switching circuit comprises a plurality of switches.

16. The system of claim 15, wherein the processor is configured such that the at least partially deactivating of the switching circuit comprises activating a first portion of the plurality of switches while deactivating a second portion of the plurality of switches.

17. The system of claim 16, wherein the processor is further configured to:
re-operate the switching circuit in the second mode after the monitoring of the decay of the current after the at least partially deactivating of the switching circuit;
deactivate the first and second portions of the plurality of switches after the re-operating of the switching circuit in the second mode; and
monitor the decay of the current after deactivating the first and second portions of the switching circuit.

* * * * *